United States Patent
Desell et al.

(10) Patent No.: US 10,248,742 B2
(45) Date of Patent: Apr. 2, 2019

(54) ANALYZING FLIGHT DATA USING PREDICTIVE MODELS

(71) Applicant: University of North Dakota, Grand Forks, ND (US)

(72) Inventors: Travis Desell, Grand Forks, ND (US); James Higgins, Grand Forks, ND (US); Sophine Clachar, Grand Forks, ND (US)

(73) Assignee: University of North Dakota, Grand Forks, ND (US)

( * ) Notice: Subject to any disclaimer, the term of this patent is extended or adjusted under 35 U.S.C. 154(b) by 568 days.

(21) Appl. No.: 14/651,784

(22) PCT Filed: Dec. 12, 2013

(86) PCT No.: PCT/US2013/074755
§ 371 (c)(1),
(2) Date: Jun. 12, 2015

(87) PCT Pub. No.: WO2014/093670
PCT Pub. Date: Jun. 19, 2014

(65) Prior Publication Data
US 2015/0324501 A1    Nov. 12, 2015

Related U.S. Application Data

(60) Provisional application No. 61/736,432, filed on Dec. 12, 2012.

(51) Int. Cl.
*G06F 7/60*    (2006.01)
*G06F 17/50*    (2006.01)
(Continued)

(52) U.S. Cl.
CPC ......... *G06F 17/5009* (2013.01); *G01C 23/00* (2013.01); *G06F 17/10* (2013.01);
(Continued)

(58) Field of Classification Search
None
See application file for complete search history.

(56) References Cited

U.S. PATENT DOCUMENTS

| | | | | |
|---|---|---|---|---|
| 5,796,612 A | * | 8/1998 | Palmer | B64C 13/50 244/12.1 |
| 6,389,333 B1 | * | 5/2002 | Hansman | G01C 23/00 701/14 |

(Continued)

FOREIGN PATENT DOCUMENTS

| | | |
|---|---|---|
| AU | 2013359159 B2 | 11/2017 |
| EP | 2932197 | 10/2015 |
| WO | WO-2014093670 A1 | 6/2014 |

OTHER PUBLICATIONS

"Canadian Application Serial No. 2,892,538, Office Action dated May 25, 2016", 3 pgs.

(Continued)

*Primary Examiner* — Aniss Chad
*Assistant Examiner* — Nithya J Moll
(74) *Attorney, Agent, or Firm* — Schwegman Lundberg & Woessner, P.A.

(57) ABSTRACT

Various embodiments for analyzing flight data using predictive models are described herein. In various embodiments, a quadratic least squares model is applied to a matrix of time-series flight parameter data for a flight, thereby deriving a mathematical signature for each flight parameter of each flight in a set of data including a plurality of sensor readings corresponding to time-series flight parameters of a plurality of flights. The derived mathematical signatures are aggregated into a dataset. A similarity between each pair of flights within the plurality of flights is measured by calculating a distance metric between the mathematical signatures of each pair of flights within the dataset, and the measured similarities are combined with the dataset. A machine- (Continued)

learning algorithm is applied to the dataset, thereby identifying, without predefined thresholds, clusters of outliers within the dataset by using a unified distance matrix.

24 Claims, 6 Drawing Sheets

(51) Int. Cl.

| | | |
|---|---|---|
| *G06F 17/10* | (2006.01) | |
| *G06N 99/00* | (2019.01) | |
| *G06N 20/00* | (2019.01) | |
| *G01C 23/00* | (2006.01) | |
| *G06Q 10/04* | (2012.01) | |
| *G06Q 10/10* | (2012.01) | |
| *G06Q 50/30* | (2012.01) | |
| *G08G 5/00* | (2006.01) | |

(52) U.S. Cl.
CPC .......... *G06N 20/00* (2019.01); *G06N 99/005* (2013.01); *G06Q 10/04* (2013.01); *G06Q 10/10* (2013.01); *G06Q 50/30* (2013.01); *G08G 5/0043* (2013.01)

(56) References Cited

U.S. PATENT DOCUMENTS

| | | | |
|---|---|---|---|
| 6,937,924 | B1 | 8/2005 | Statler et al. |
| 9,104,747 | B2* | 8/2015 | Raichelgauz ....... G06F 17/3028 |
| 9,412,072 | B2* | 8/2016 | Chi .................... G06N 5/04 |
| 9,478,077 | B2* | 10/2016 | Chrysanthos ...... G05B 23/0227 |

OTHER PUBLICATIONS

"Canadian Application Serial No. 2,892,538, Response filed Nov. 23, 2016 to Office Action dated May 25, 2016", 13 pgs.
"European Application Serial No. 13818072.4, Office Action dated Jul. 21, 2015", 2 pgs.
"European Application Serial No. 13818072.4, Response filed Jan. 28, 2016 to Office Action dated Jul. 21, 2015", 12 pgs.
"International Application Serial No. PCT/US2013/074755, International Preliminary Report on Patentability dated Jun. 25, 2015", 8 pgs.
"Australian Application Serial No. 2013359159, First Examiner Report dated Mar. 20, 2017", 3 pgs.
"Australian Application Serial No. 2013359159, Response filed Jun. 7, 2017 to First Examiner Report dated Mar. 20, 2017", w/ English Translation, 18 pgs.
"Canadian Application Serial No. 2,892,538, Office Action dated Jun. 19, 2017", w/ English Translation, 3 pgs.
"Canadian Application Serial No. 2,892,538, Response filed Dec. 18, 2017 to Office Action dated Jun. 19, 2017", 10 pgs.
"Canadian Application Serial No. 2,892,538, Office Action dated Jun. 28, 2018", 4 pgs.
"European Application Serial No. 13818072.4, Communication Pursuant to Article 94(3) EPC dated Jun. 4, 2018", 6 pgs.
"Canadian Application Serial No. 2,892,538, Response filed Aug. 31, 2018 to Office Action dated Jun. 28, 2018", 17 pgs.
"European Application Serial No. 13818072.4, Response filed Oct. 4, 2018 to Communication Pursuant to Article 94(3) EPC dated Jun. 4, 2018", 13 pgs.
"International Application Serial No. PCT/US2013/074755, International Search Report dated Apr. 22, 2014".
"International Application Serial No. PCT/US2013/074755, Written Opinion dated Apr. 22, 2014".
"Peltarion: Selg-organizing map", [Online]. Retrieved from the Internet: <URL: http://www.peltarion.com/doc/index.php?title=Self-Organizing_Maps>, (Accessed on: Jun. 11, 2015), 7 pgs.
Cottrell, Marie, et al., "Fault prediction in aircraft engines using Self-Organizing Maps", Advances in Self-Organizing Maps, Springer Berlin Heidelberg, (2009), 37-44.
Kim, Kyusung, et al., "Fault diagnosis in turbine engines using unsupervised neural networks technique", Proceedings of SPIE—the International Society for Optical Engineering, (2004), 150-158.

* cited by examiner

ANALYZING FLIGHT DATA USING PREDICTIVE MODELS

CLAIM OF PRIORITY

This patent application is a U.S. National Stage Filing under 35 U.S.C. § 371 from International Application No. PCT/US2013/074755, entitled "ANALYZING FLIGHT DATA USING PREDICTIVE MODELS," filed Dec. 12, 2013, published in English as WO 2014/093670, which claims the benefit of priority, under 35 U.S.C. § 119(e), to U.S. Provisional Patent Application Ser. No. 61/736,432, entitled "SYSTEMS AND METHODS FOR ANALYZING FLIGHT DATA USING PREDICTIVE MODELS," filed on Dec. 12, 2012, each of which is hereby incorporated by reference herein in its entirety.

TECHNICAL FIELD

Embodiments pertain to analyzing flight, telemetry, and flight maintenance data. Some embodiments relate to analyzing flight, telemetry, and flight maintenance data using predictive models.

BACKGROUND

The Federal Aviation Administration (FAA) and other regulatory agencies have relied on reactive measures to attempt to ensure safe practices in the National Airspace Systems (NAS). However, reactive analysis does not circumvent most safety issues, as reactive analysis is often employed after an event has occurred. Industry experts are now advocating proactive measures, which may identify accident precursors to mitigate risks. However, several considerations impede this analysis. First, the disparate nature of flight, telemetry, and maintenance data presents dimensionality challenges. Second, accumulated flight, telemetry, and maintenance data often requires large-scale data analysis and scalable solutions. Finally, identifying risks in flight, telemetry, and maintenance data can be difficult.

Therefore, there are general needs for systems and methods for analyzing flight, telemetry, and maintenance data that can be performed using standardized models and methods.

DETAILED DESCRIPTION

Figure 1:
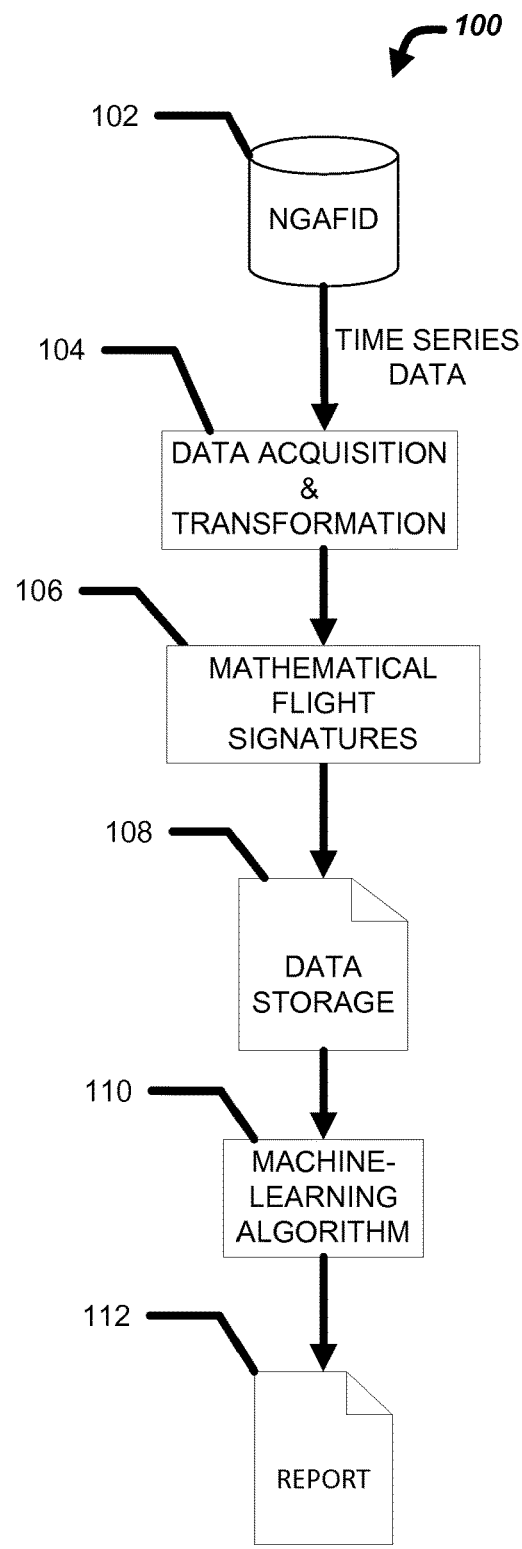
FIG. 1 illustrates an operational environment of a system that supports analyzing flight and maintenance data using predictive models, in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As used in this patent application, the term "flight data" may include, but is not limited to, data acquired from flights of manned and unmanned aircraft, telemetry data, and aircraft maintenance data.

Statistics show that many accidents/incidents in aviation have causes which are recurrent. Therefore, strategies can be employed to learn from flight data to identify accident precursors to mitigate potential safety hazards. Predictive data mining identifies patterns and detects trends through clustering, classification, or regression analysis.

Onboard flight data also includes certain mechanical status information, such as fuel flow, exhaust gas temperature, oil pressure, etc. This data, if analyzed properly, may give indications of mechanical statuses such as current engine compression ratios and impending irregularities and failures such as engine failures, electrical system abnormalities, and valve malfunctions. A system capable of analyzing this data may give an early-warning and risk-free (without taking flight) notice to aircraft operators that a mechanical problem is likely to occur in the near future. The operator could then address the problem prior to the aircraft taking flight and prevent a mechanical anomaly from occurring.

As data collection continues to experience exponential growth and the cost of large-scale storage devices becomes cheaper, there is an abundance of data from which a wealth of knowledge can be obtained. Data mining is the process of exploring data to predict new situations, discover meaningful patterns and detect trends in data. Several industries have benefitted from the use of data mining techniques, as it is able to explore the intricacies of complex systems and explain underlying phenomena.

In aviation, aircraft that are equipped with a flight data recording capability or device, such as a Flight Data Recorder (FDR) or a Quick Access Recorder (QAR), record hundreds, and sometimes thousands, of flight and mechanical parameters at various time intervals. This data may hold key information regarding the aircraft's operations during various phases of flight, and may be used to identify unsafe practices and violations of standard operating procedures. One approach used to collect and analyze such data includes Flight Data Monitoring (FDM) or Flight Operations Quality Assurance (FOQA). FDM/FOQA is a methodology for collecting and analyzing flight data to proactively identify anomalies and mitigate risks associated with unsafe practices. The FDM/FOQA process includes four main steps:

1. Record: acquisition of data from the aircraft,
2. Retrieve: obtain the data onto a storage media,
3. Review: analyze data to detect atypical flights and accident precursors, and
4. Report: state findings to assist with retraining efforts to promote safe practices.

The purpose of these four steps is to assist with identifying and intercepting accident precursors to promote safe and efficient practices. FDM programs employ statistical methods to identify exceedances, trends, violations of standard operating procedures, and other predefined criteria that are specified by the FAA and other regulatory agencies. FDM technologies have been successfully employed by airlines for many years, contributing to their low accident and fatality rates. The FDM/FOQA process can also be used in the analysis of mechanical and aircraft system parameters to look for exceedances, trends, violations of standard operating procedures, and other predefined criteria. However, the general aviation community has yet to reap the benefits of full-fledged FDM/FOQA programs.

General aviation (GA) is one of two branches of civil aviation that pertains to the operation of all non-scheduled and non-military aircraft in the National Airspace System. GA includes fixed-wing airplanes, helicopters (rotorcraft), balloons, dirigibles, gliders, etc., and comprises 54% of all civil aviation activity within the United States. GA is a very valuable and lucrative industry; however, it has the highest accident rates within civil aviation. As of 2009, the general aviation accident rate was 7.2 per 100,000 flight hours, and 1.33 fatalities per 100,000 flight hours. Eight out of ten GA accidents are caused by pilot actions. Reducing GA fatality rates requires improvements to the aircraft, flying environment, and pilot performance. However, since GA is very diverse, the traditional FDM approach of specifying predefined analysis criteria will be inadequate, as analysis varies based on the aircraft's make and model. In addition, in order to extract useful information from flight data, one needs to be adept in the possible types of analysis in order to establish correlations between variables. Analyzing a vast amount of information has many challenges; consequently, machine-learning techniques may be advantageous in this area.

Unmanned Aerial Systems (UAS) are aerial systems that use unmanned aerial vehicles ("UAV"s or "drones"). Typically, UAS operators are physically disconnected from their aircraft, which further leads to missed warning signs or precursors relating to mechanical anomalies and airframe incidents/accidents. UAS currently have numerous alarms for warning and caution situations in flight, but these alarms are limited in that they are reactive: a predetermined value must be exceeded before the discrepancy is announced. Embodiments described herein may detect subtle changes in flight performance, allowing for a more predictive approach. Some embodiments may also be used with Optionally Piloted Vehicles ("OPV"s).

The technical basis for data mining is machine learning, which may be used to extract information from raw data. The steps of machine learning may include data transformation, cleansing, and analysis. Machine learning has several advantages. First, machine learning is very accurate when compared to traditional rule-based and query-based approaches. Second, machine-learning techniques are often mathematically tractable. Third, machine-learning techniques have the ability to explore and classify data, even when there is a lack of expertise in the problem domain. Finally, machine-learning algorithms have the ability to learn by example. However, machine learning also has disadvantages. Machine learning algorithms have the possibility of over-fitting or under-fitting the problem space, and the algorithms may be susceptible to noise.

There are three types of machine learning strategies: supervised, unsupervised and reinforcement learning. Supervised learning, also called classification, is the process of finding a suitable training set that classifies new problems, whose label is unknown. Examples of classification techniques include decision tree induction, Bayesian networks, k-nearest neighbor, and support vector machines. In unsupervised learning, also called clustering, the algorithm is provided with unlabeled data that it uses to group items based on their similarity with each other. Clustering techniques include k-means, fuzzy c-means, and Density Based Spatial Clustering of Applications with Noise (DBSCAN). Reinforcement learning operates on a merit system and its course of actions is determined by what yields the greatest reward. However, reinforcement learning is rarely applied in practical data mining.

Mining GA flight data poses many challenges. First, the flight parameters recorded by the FDR/QAR varies by the model of aircraft; the number of parameters recorded ranges from a minimum of one parameter to over 2000 parameters. In the case of UAS flight, a separate data/telemetry package file may be created for each UAS flight, and the data may be streamed as a part of the command and control link. Second, flight data may consist of discrete and continuous time series data, which are recorded at various time intervals. Therefore, data dimensionality issues may occur. Finally, analyzing and reducing the dimension of data without losing potentially critical information may be very difficult.

An Artificial Neural Network (ANN) is a mathematical model that mimics the structure and behavior of a biological neural network. ANNs are represented as a directed graph of interconnected neurons. Neurons, also called nodes or processing units, influence each other using weighted connections; positive weights have stimulating influence, while negative weights have inhibiting influence. ANNs can be effectively used for classification, clustering, forecasting, pattern recognition, and dimension reduction. ANNs possess several advantages, including a high level of accuracy and efficiency, noise tolerance, ability to process large-scale data, speed, and adaptability. Their disadvantages may include the inability to determine the optimal number of neurons, and difficulty in selecting a training set that is representative of the problem to be solved. The effectiveness of neural networks lies in their ability to learn and classify data without being influenced by invalid data, as the learning process allows for adjustments to any bias incurred. However, a large amount of erroneous data will affect the quality of the overall solution.

Embodiments discussed herein may use various machine-learning techniques, such as Support Vector Machines ("SVM"s), predictive neural networks, self-organizing maps ("SOM"s), etc. SOMs are a special class of artificial neural networks that project high dimensional data into a low dimensional feature space. SOMs can be effectively used in the exploratory phase of data mining to visualize and explore the properties of data, while preserving the data topology. This means that the relationship between data is preserved, as they will be mapped within close proximity if they are related and will be sensitive to similar inputs in the model. SOMs consist of an input and an output layer, which is organized in a lattice. Inputs are influenced by weights, which tune the lattice using an unsupervised competitive learning process. After training completes, the SOM is able to classify new data using the tuned lattice and the knowledge acquired in the learning phase.

An outlier, or an atypical flight, may indicate the presence of an error or may be a precursor for an accident. Detecting outliers may assist in predicting the conditions, under which an accident may occur. Current technologies for flight aviation safety/data mining use fixed exceedances, where an error is flagged only if a certain value exceeds a set error threshold. Various embodiments use neural network technology to learn which values are outliers, and form connections between different pieces of data to offer a more robust detection of errors and outliers. For example, three flight data values may not be above the set exceedances that would normally flag as an error; however, if all three were close to those values, the neural network can learn that this is still unusual activity and detect an error because of the combination of those three values. Furthermore, some embodiments may be used to compare flights with different recorded parameters.

FIG. 1 illustrates an operational environment 100 of a system supporting analyzing flight data using predictive models, in accordance with some embodiments. In some embodiments, a database 102 stores GA flight data. The analysis may begin by querying the database 102 by aircraft fleet; the query result may return time series data for each flight. Due to the nature of aircraft data, where parameters may be recorded at different time intervals, the query result may be a high dimensional vector of features for each flight.

Therefore, the data may need to be transformed into a representation that facilitates ease of analysis.

The data acquisition and transformation step 104 may include data de-identification and data cleansing. Data de-identification may deter traceability of flight data to an individual flight operator. This step may be performed in the database. The data de-identification may also remove database keys and other unique identifiers. Data cleansing may remove features that do not contribute to the analysis process, as well as null/empty features.

A mathematical signature 106 may then be derived for each feature of each flight. The resulting signatures 106 for all flights may be stored 108 in an XML file, in a database, in a flat-file, or other means of storing data.

The signatures 106, 108 may then be used as input to a machine-learning algorithm 110, such as a SOM. The objective of the machine-learning algorithm 110 is to explore the unlabeled data to discover natural groupings based on a similarity metric. The machine-learning algorithm 110 may be applied to the data using a distance metric. The distance metric may measure similarity between flights based on proximity to each other.

After the machine-learning algorithm 110 has been applied to the dataset, clusters may be identified by using a Unified Distance Matrix (U-Matrix.) The U-Matrix may allow high-dimensional data to be viewed as a two-dimensional image. The two-dimensional image may show outliers and errors that were classified by the machine-learning algorithm 110. A human viewing the two-dimensional image may verify or flag as incorrect each classification. Information about which of the outliers the machine-learning algorithm 110 improperly classified as outliers or errors can then be fed back into the machine-learning algorithm 110 to improve the accuracy of the machine-learning algorithm 110 in a more supervised manner.

Figure 2:
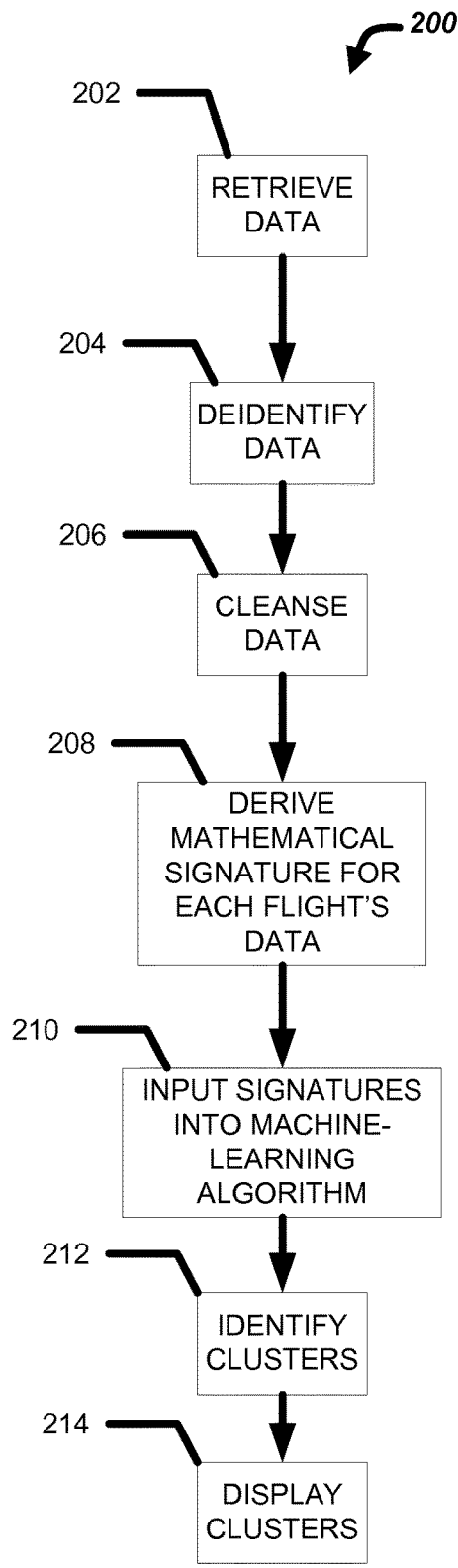
FIG. 2 illustrates a method of analyzing flight and maintenance data using predictive models, in accordance with some embodiments.

FIG. 2 illustrates a method 200 of analyzing flight data using predictive models, in accordance with some embodiments. Data may be retrieved 202 from a database, a flat-file, or another means for data storage.

The data may be de-identified 204 to deter traceability of flight data to an individual flight operator. If the data is retrieved from a database, data de-identification 204 may be performed in the database. The data de-identification 204 may also remove database keys and other unique identifiers.

The data may be cleansed 206 to remove features (parameters) that do not contribute to the analysis process, as well as null/empty features.

A mathematical signature may then be derived 208 for each feature of each flight. The time-series data for each feature (i.e. parameter) of a flight may be arranged in a matrix. Mathematical signatures of continuous time series flight data can be derived 208 using models, such as the quadratic least squares model, $$y=at^2+bt+c+\epsilon$$

with time as t, y as the vector of data (i.e. the features), and $\epsilon$ as the noise or variability. Solving for the coefficients a, b, c, and $\epsilon$ provides the average value (magnitude), velocity (rate of change), acceleration, and noise for each respective feature (parameter). The coefficient data may then be summarized by calculating the mean, standard deviation, maximum, and minimum values for each coefficient of each parameter.

The resulting signatures for all flights may be stored in an XML file, in a database, in a flat-file, or other means of storing data. The signatures may then be used as input to a machine-learning algorithm 210, such as a SOM. The objective of the machine-learning algorithm 210 is to explore the unlabeled data to discover natural groupings based on a distance metric. The distance metric may measure similarity between flights based on proximity to each other.

One of a number of different distance metrics may be used. The Euclidean distance metric measures the similarity between two vectors by calculating the length of the distance between them. Euclidean distance is given by the following formula:

$$D=\sqrt{\sum_{i=1}^{n}(x_i-y_i)^2}$$

where x and y are vectors in n-Euclidean space.

The Mahalanobis distance metric is a form of computing a "z score," which measures the distance between data while preserving its magnitude. The formula for Mahalanobis distance is as follows:

$$D=\sqrt{(x-y)^T C^{-1}(x-y)}$$

where x and y are vectors of observed measurements, C is a covariance matrix, and T represents the transposition function.

Norm S.D. is a distance metric that normalizes the data based on the dataset's mean and standard deviation. Norm S.D. is given by the following formula:

$$D = \sqrt{\sum_{i=1}^{n} \left(\frac{\mu_i - x_i}{\sigma_i} - \frac{\mu_i - y_i}{\sigma_i}\right)^2}$$

where $\mu$ is the sample mean, x and y are vectors of observed measurements in n-Euclidean space, and $\sigma$ is the standard deviation for the sample.

After the machine-learning algorithm 210 has been applied to the dataset, clusters may be identified 212 by using a Unified Distance Matrix (U-Matrix.) The U-Matrix may allow the clusters to be displayed 214 as a two-dimensional image. The two-dimensional image may show outliers and errors that were classified by the machine-learning algorithm 210. A human viewing the two-dimensional image 214 may verify or flag as incorrect each classification. Information about which of the outliers the machine-learning algorithm 210 improperly classified as outliers or errors can then be fed back into the machine-learning algorithm 210 to improve the accuracy of the machine-learning algorithm 210 in a more supervised manner.

Figure 3A:
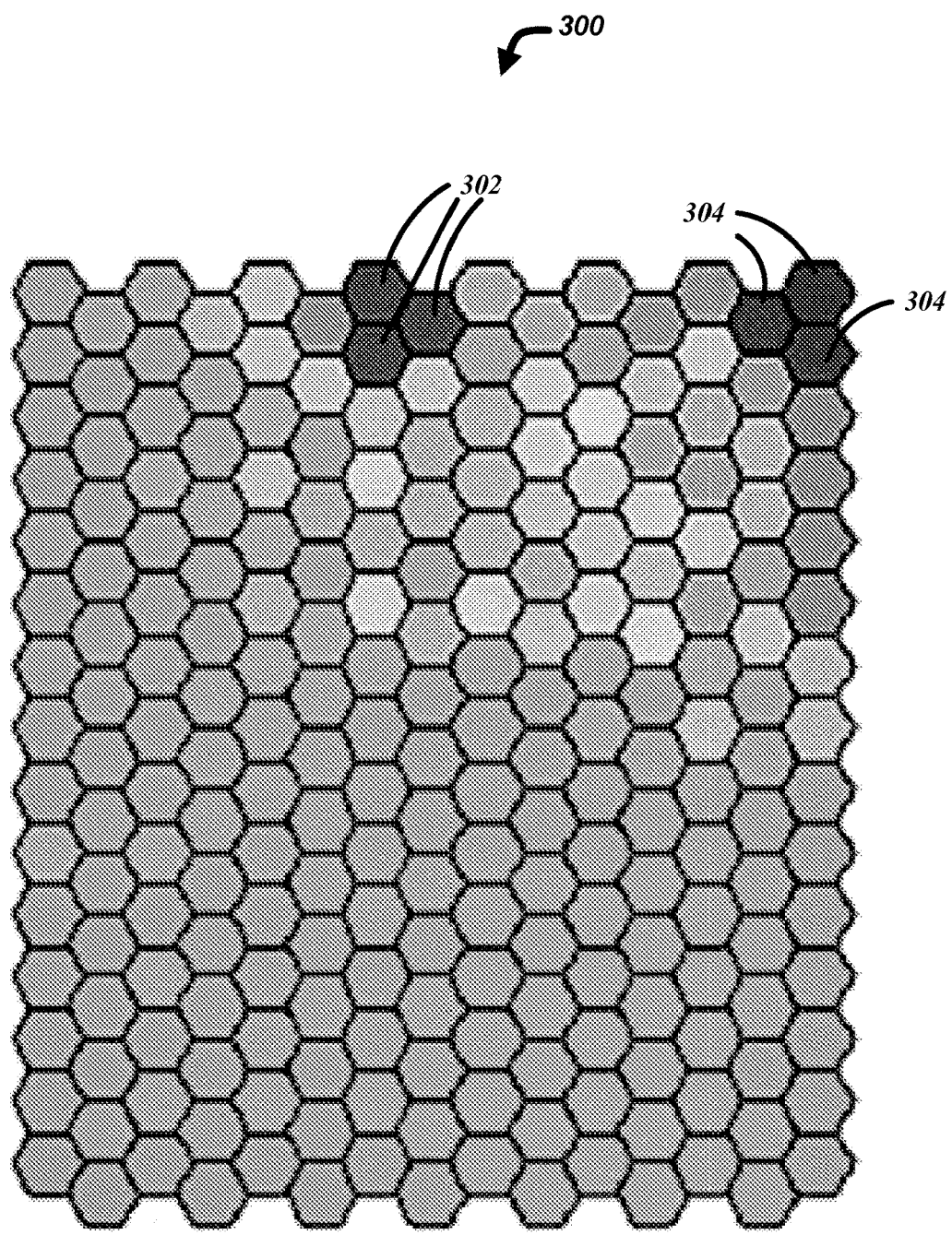
FIG. 3A depicts a graphical, two-dimensional display of clusters of three-dimensional flight and maintenance data after being analyzed by self-organizing maps, in accordance with some embodiments.

FIG. 3A depicts an example of a graphical, two-dimensional display 300 of clusters of three-dimensional flight data after being analyzed by self-organizing maps, in accordance with some embodiments. The display 300 may be created by using a U-Matrix (unified distance matrix) on the values of the nodes of the self-organizing map, thereby clustering the nodes based on their distance to each other. In the example display 300, two clusters (302 and 304) of outliers were identified.

Figure 3B:
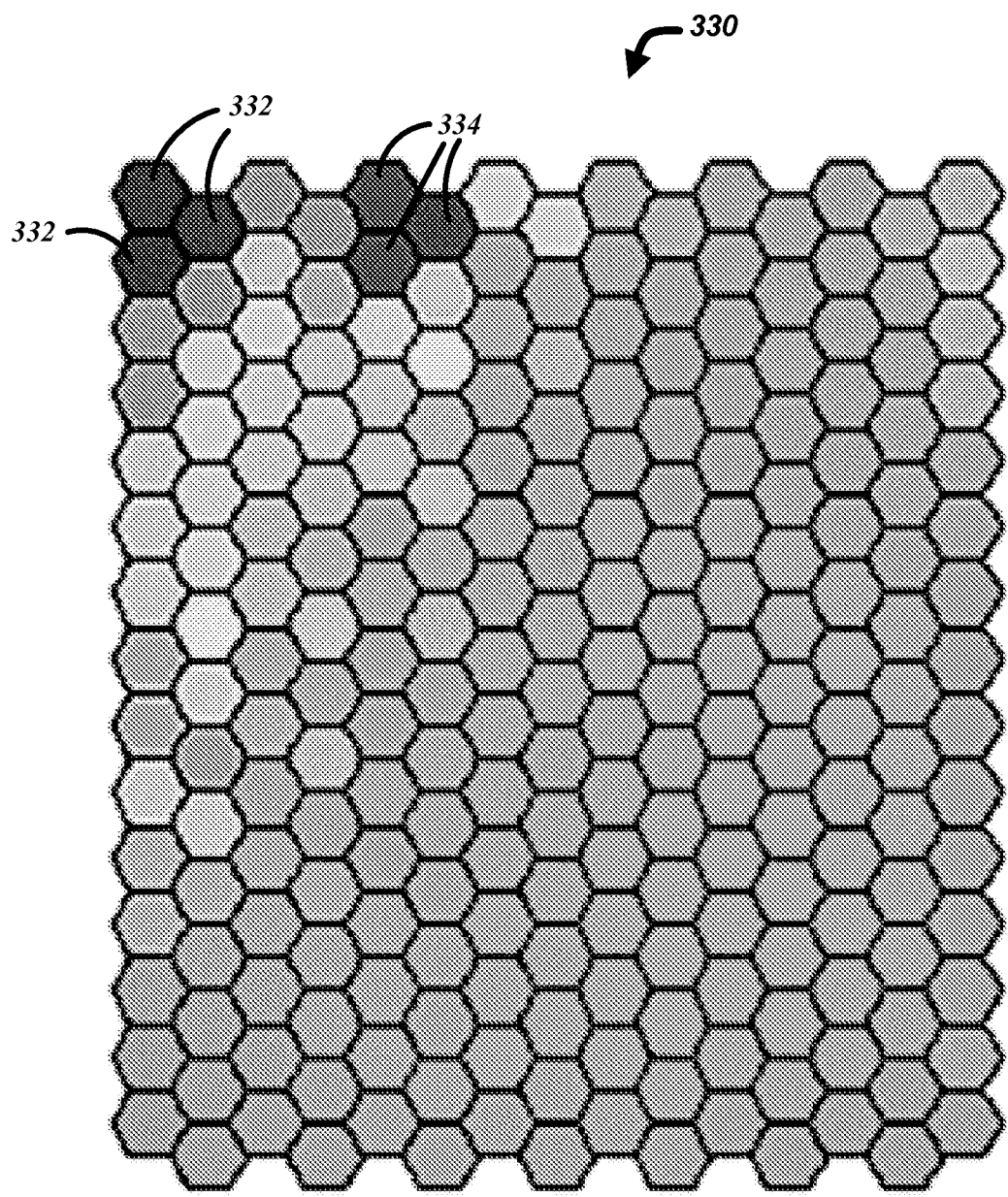
FIG. 3B depicts a graphical, two-dimensional display of clusters of five-dimensional flight and maintenance data after being analyzed by self-organizing maps, in accordance with some embodiments.

FIG. 3B depicts an example of a graphical, two-dimensional display 330 of clusters of five-dimensional flight data after being analyzed by self-organizing maps, in accordance with some embodiments. The display 330 may be created by using a U-Matrix (unified distance matrix) on the values of the nodes of the self-organizing map, thereby clustering the nodes based on their distance to each other. In the example display 330, two clusters (332 and 334) of outliers were identified.

Figure 3C:
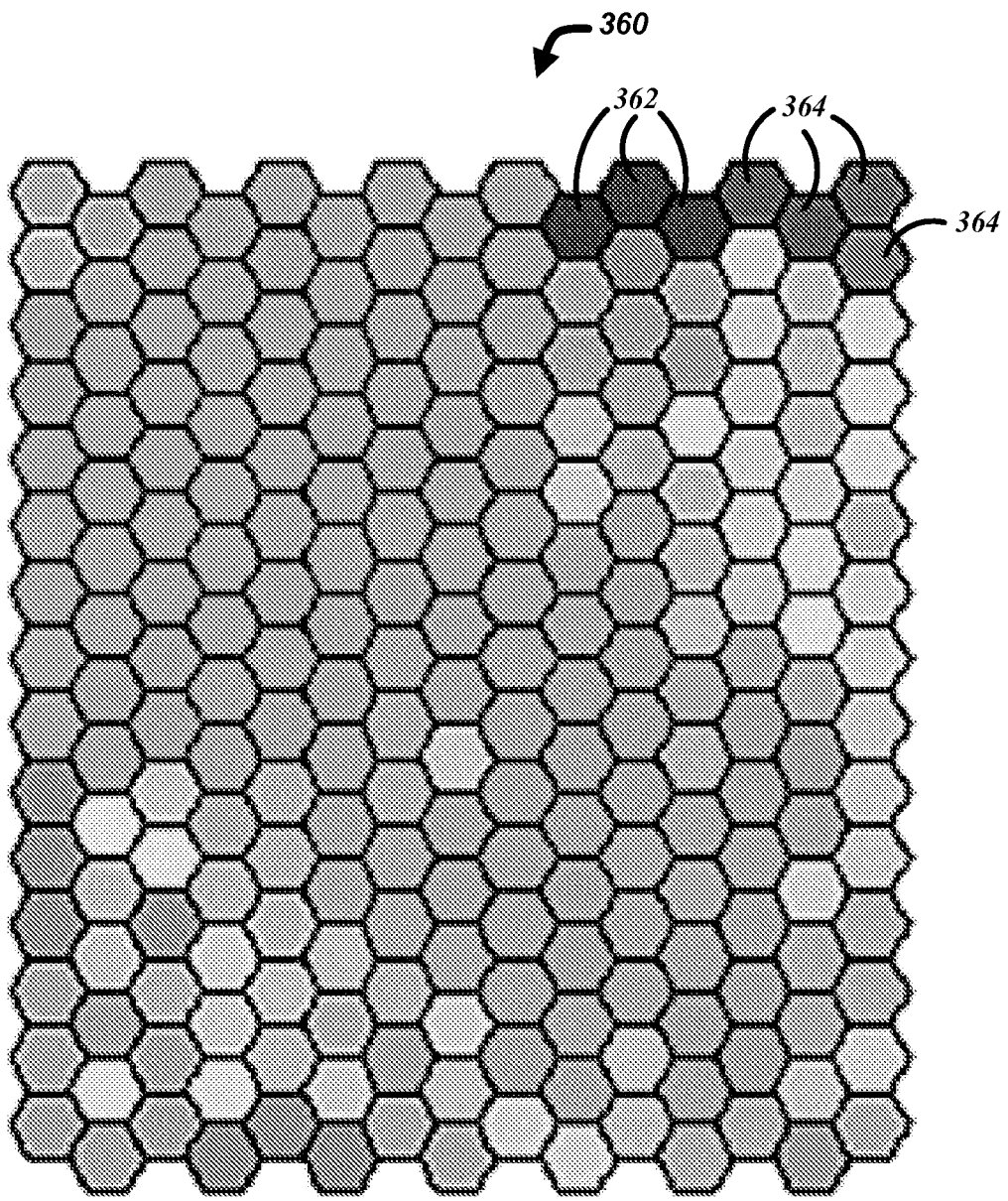
FIG. 3C depicts a graphical, two-dimensional display of clusters of eight-dimensional flight and maintenance data after being analyzed by self-organizing maps, in accordance with some embodiments.

FIG. 3C depicts an example of a graphical, two-dimensional display 360 of clusters of eight-dimensional flight data after being analyzed by self-organizing maps, in accordance with some embodiments. The display 360 may be created by using a U-Matrix (unified distance matrix) on the values of the nodes of the self-organizing map, thereby clustering the nodes based on their distance to each other. In the example display 360, two clusters (362 and 364) of outliers were identified.

Graphical displays, such as examples 300, 330, and 360, may use a number of different methods, including colors, shading, or the like, to allow a viewer to distinguish clusters more easily.

Figure 4:
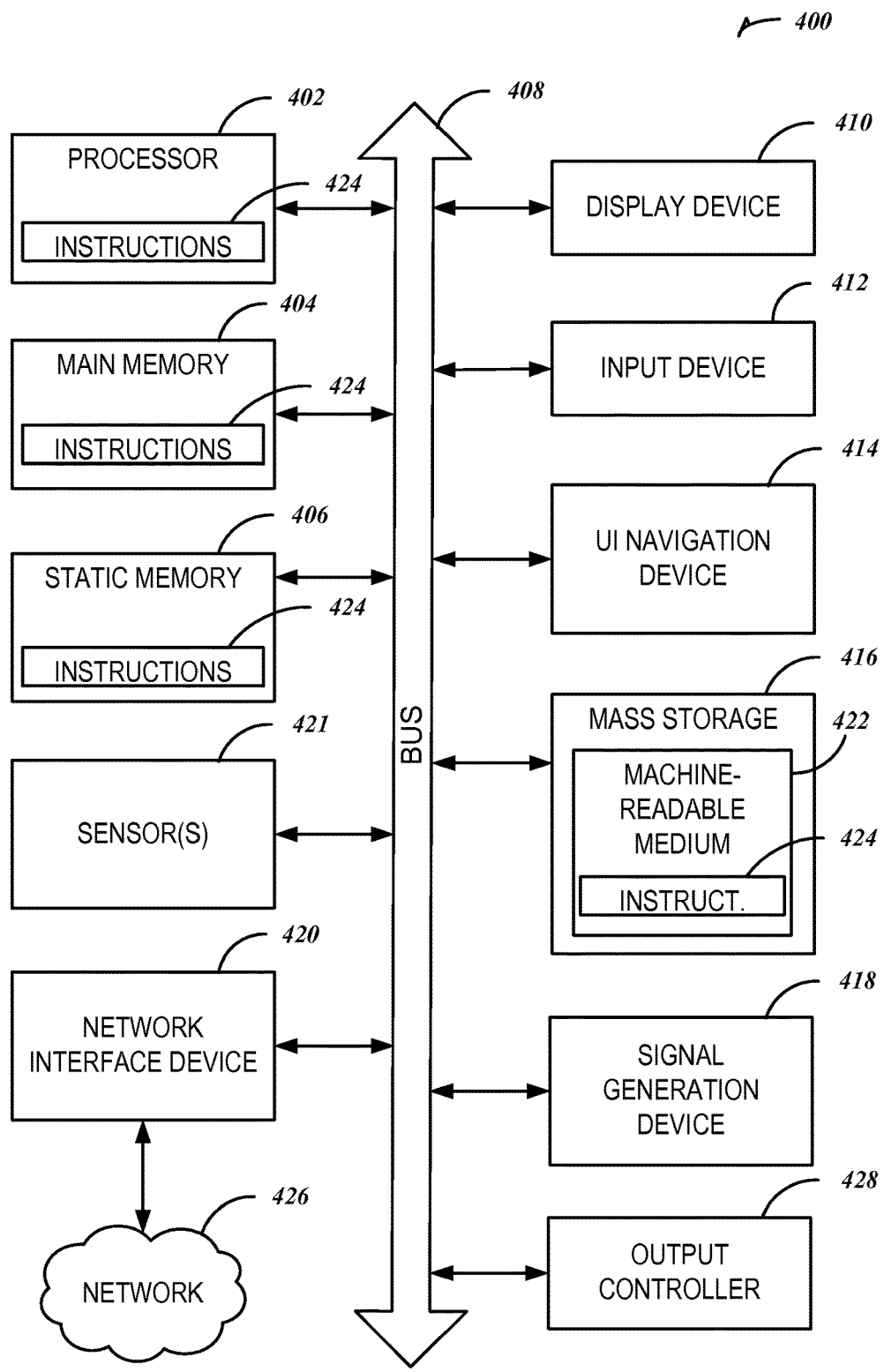
FIG. 4 is a block diagram of an example machine, performing the method of analyzing flight and maintenance data using predictive models, in accordance with some embodiments.

FIG. 4 illustrates a block diagram of an example machine 400 upon which any one or more of the techniques (e.g., methodologies) discussed herein can perform. In alternative embodiments, the machine 400 can operate as a standalone device or can be connected (e.g., networked) to other machines. In a networked deployment, the machine 400 can operate in the capacity of a server machine, a client machine, or both in server-client network environments. In an example, the machine 400 can act as a peer machine in peer-to-peer (P2P) (or other distributed) network environment. The machine 400 can be a personal computer (PC), a tablet PC, a set-top box (STB), a Personal Digital Assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate on, logic or a number of components, modules, or mechanisms. Modules are tangible entities capable of performing specified operations and can be configured or arranged in a certain manner. In an example, circuits can be arranged (e.g., internally or with respect to external entities such as other circuits) in a specified manner as a module. In an example, the whole or part of one or more computer systems (e.g., a standalone, client or server computer system) or one or more hardware processors can be configured by firmware or software (e.g., instructions, an application portion, or an application) as a module that operates to perform specified operations. In an example, the software can reside (1) on a non-transitory machine-readable medium or (2) in a transmission signal. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor can be configured as respective different modules at different times. Software can accordingly configure a hardware processor, for example, to constitute a particular module at one instance of time and to constitute a different module at a different instance of time.

Machine (e.g., computer system) 400 can include a hardware processor 402 (e.g., a central processing unit (CPU), a graphics processing unit (GPU), a hardware processor core, or any combination thereof), a main memory 404 and a static memory 406, some or all of which can communicate with each other via a bus 408. The machine 400 can further include a display unit 410, an alphanumeric input device 412 (e.g., a keyboard), and a user interface (UI) navigation device 414 (e.g., a mouse). In an example, the display unit 410, input device 412 and UI navigation device 414 can be a touch screen display. The machine 400 can additionally include a storage device (e.g., drive unit) 416, a signal generation device 418 (e.g., a speaker), a network interface device 420, and one or more sensors 421, such as a global positioning system (GPS) sensor, compass, accelerometer, or other sensor. The machine 400 can include an output controller 428, such as a serial (e.g., universal serial bus (USB), parallel, or other wired or wireless (e.g., infrared (IR)) connection to communicate or control one or more peripheral devices (e.g., a printer, card reader, etc.).

The storage device 416 can include a machine-readable medium 422 on which is stored one or more sets of data structures or instructions 424 (e.g., software) embodying or utilized by any one or more of the techniques or functions described herein. The instructions 424 can also reside, completely or at least partially, within the main memory 404, within static memory 406, or within the hardware processor 402 during execution thereof by the machine 400. In an example, one or any combination of the hardware processor 402, the main memory 404, the static memory 406, or the storage device 416 can constitute machine-readable media.

While the machine-readable medium 422 is illustrated as a single medium, the term "machine-readable medium" can include a single medium or multiple media (e.g., a centralized or distributed database, and/or associated caches and servers) that configured to store the one or more instructions 424.

The term "machine-readable medium" can include any tangible medium that is capable of storing, encoding, or carrying instructions for execution by the machine 400 and that cause the machine 400 to perform any one or more of the techniques of the present disclosure, or that is capable of storing, encoding or carrying data structures used by or associated with such instructions. Non-limiting machine-readable medium examples can include solid-state memories, and optical and magnetic media. Specific examples of machine-readable media can include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 424 can further be transmitted or received over a communications network 426 using a transmission medium via the network interface device 420 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), peer-to-peer (P2P) networks, among others. In an example, the network interface device 420 can include one or more physical jacks (e.g., Ethernet, coaxial, or phone jacks) or one or more antennas to connect to the communications network 426. In an example, the network interface device 420 can include a plurality of antennas to communicate wirelessly using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 400, and includes digital or analog communications signals or other intangible medium to facilitate communication of such software.

Although example machine 400 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), radio-frequency integrated circuits (RFICs) and combinations of various hardware and logic circuitry for performing at least the functions described herein. In some embodiments, the functional elements of system 400 may refer to one or more processes operating on one or more processing elements.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, system 400 may include one or more processors and may be configured with instructions stored on a computer-readable storage device.

The systems and methods described herein may be used to identify potentially hazardous conditions during flight. Upon identification of a potentially hazardous condition, actions may be taken to attempt to prevent or mitigate the hazard. For example, if control servo analysis detects a poor flight control situation, a pilot could be alerted; the pilot could then attempt to prevent a stall or spin, and could return to recovery sight if an engine failure was predicted to be imminent.

The systems and methods described herein may be used to monitor the amount of missing information in a telemetry file; an impending control link failure could be announced and the complete failure prevented if a pilot was aware of the increase in missing information.

The systems and methods described herein may be applied to analyze complex systems other than flight data. For example, this technology can be applied to data acquired from power plant components (engines), which would allow for detection of outliers within the engine data to determine if engine failure is occurring or is about to occur. Another example would include the capability to determine the current engine health, such as compression ratios, by conducting an analysis of historic maintenance data and training the systems and methods described herein to detect similar clusters.

Further, although the data that may be required to train the neural network could be massive, the computational systems that have already been trained by the neural network require little actual storage. This means that properly trained and updated neural networks can be placed on onboard flight instrument displays or mobile devices and used to detect and predict outliers/failures as they occur, as opposed to after the fact in an offline manner.

Onboard flight computing capabilities can be used to process the flight data in real-time, and using the analysis described above, may alert the aircraft operator of an impending flight or mechanical anomaly. The alert may be placed on an onboard flight instrument display instrument or panel (either standalone or integrated with the installed avionics), a mobile device, etc.

Mobile devices are becoming widely used in aviation. An application implementing the analysis described above could be placed on a mobile device, and periodically updated with information from neural network trained by a large database of flight information. The mobile device could also be used as an instrument to gather engine/flight data, which can be uploaded to the flight database after or during the flights, and later used to further train and improve the neural network.

Additional Notes & Examples

The following examples pertain to further embodiments.

Example 1 includes subject matter (such as a device, apparatus, or system) comprising at least one processor, at least one memory device, wherein the at least one memory device stores a program to cause the at least one processor to derive, using a quadratic least squares model applied to a matrix of time-series flight parameter data for a flight, a mathematical signature for each flight parameter of each flight in a set of data including a plurality of sensor readings corresponding to time-series flight parameters of a plurality of flights; aggregate the derived mathematical signatures into a dataset; measure a similarity between each pair of flights within the plurality of flights by calculating a distance metric between the mathematical signatures of each pair of flights within the dataset; combine the measured similarities with the dataset; apply a machine-learning algorithm to the dataset; and identify, without predefined thresholds, clusters of outliers within the dataset by using a unified distance matrix.

In Example 2, the subject matter of Example 1 may optionally include the machine-learning algorithm being a self-organizing map algorithm.

In Example 3, the subject matter of any one or both of Examples 1 and 2 may optionally include the distance metric being a Euclidean metric, such as $D=\sqrt{\Sigma_{i=1}^{n}(x_i-y_i)^2}$.

In Example 4, the subject matter of any one or more of Examples 1-3 may optionally include the distance metric being a Mahalanobis metric, such as $D=\sqrt{(x-y)^T C^{-1}(x-y)}$.

In Example 5, the subject matter of any one or more of Examples 1-4 may optionally include the distance metric being a standard deviation metric, such as $$D = \sqrt{\sum_{i=1}^{n} \left(\frac{\mu_i - x_i}{\sigma_i} - \frac{\mu_i - y_i}{\sigma_i}\right)^2}.$$

In Example 6, the subject matter of any one or more of Examples 1-5 may optionally include the distance metric being a Gaussian metric.

In Example 7, the subject matter of any one or more of Examples 1-6 may optionally include the clusters of outliers representing anomalous flights.

Example 8 may include, or may optionally be combined with the subject matter of any one or more of Examples 1-7 to include, subject matter (such as a method, means for performing acts, or machine-readable medium including a plurality of instructions that, in response to being executed on a computing device, cause the computing device to perform acts) comprising to derive, using a quadratic least squares model applied to a matrix of time-series flight parameter data for a flight, a mathematical signature for each flight parameter of each flight in a set of data including a plurality of sensor readings corresponding to time-series flight parameters of a plurality of flights; aggregate the derived mathematical signatures into a dataset; measure a similarity between each pair of flights within the plurality of flights by calculating a distance metric between the mathematical signatures of each pair of flights within the dataset; combine the measured similarities with the dataset; apply a machine-learning algorithm to the dataset; and identify, without predefined thresholds, clusters of outliers within the dataset by using a unified distance matrix.

In Example 9, the subject matter of any one or more of Examples 1-8 may optionally include the machine-learning algorithm being a self-organizing map algorithm.

In Example 10, the subject matter of any one or more of Examples 1-9 may optionally include the distance metric being a Euclidean metric, such as $D=\sqrt{\Sigma_{i=1}^{n}(x_i-y_i)^2}$.

In Example 11, the subject matter of any one or more of Examples 1-10 may optionally include the distance metric being a Mahalanobis metric, such as $D=\sqrt{(x-y)^T C^{-1}(x-y)}$.

In Example 12, the subject matter of any one or more of Examples 1-11 may optionally include the distance metric being a standard deviation metric, such as $$D = \sqrt{\sum_{i=1}^{n} \left(\frac{\mu_i - x_i}{\sigma_i} - \frac{\mu_i - y_i}{\sigma_i}\right)^2}.$$

In Example 13, the subject matter of any one or more of Examples 1-12 may optionally include the distance metric being a Gaussian metric.

In Example 14, the subject matter of any one or more of Examples 1-13 may optionally include the clusters of outliers representing anomalous flights.

Example 15 may include, or may optionally be combined with the subject matter of any one or more of Examples 1-14 to include, subject matter (such as a method, means for performing acts, or machine-readable medium including a plurality of instructions that, when performed by a machine, cause the machine to perform acts) comprising deriving, using a quadratic least squares model applied to a matrix of time-series flight parameter data for a flight, a mathematical signature for each flight parameter of each flight in a set of data including a plurality of sensor readings corresponding to time-series flight parameters of a plurality of flights; aggregating the derived mathematical signatures into a dataset; measuring a similarity between each pair of flights within the plurality of flights by calculating a distance metric between the mathematical signatures of each pair of flights within the dataset; combining the measured similarities with the dataset; applying a machine-learning algorithm to the dataset; and identifying, without predefined thresholds, clusters of outliers within the dataset by using a unified distance matrix.

In Example 16, the subject matter of any one or more of Examples 1-15 may optionally include the machine-learning algorithm being a self-organizing map algorithm.

In Example 17, the subject matter of any one or more of Examples 1-16 may optionally include the distance metric being a Euclidean metric, such as $D=\sqrt{\Sigma_{i=1}^{n}(x_i-y_i)^2}$.

In Example 18, the subject matter of any one or more of Examples 1-17 may optionally include the distance metric being a Mahalanobis metric, such as $D=\sqrt{(x-y)^T C^{-1}(x-y)}$.

In Example 19, the subject matter of any one or more of Examples 1-18 may optionally include the distance metric being a standard deviation metric, such as $$D = \sqrt{\sum_{i=1}^{n} \left(\frac{\mu_i - x_i}{\sigma_i} - \frac{\mu_i - y_i}{\sigma_i}\right)^2}.$$

In Example 20, the subject matter of any one or more of Examples 1-19 may optionally include the distance metric being a Gaussian metric.

In Example 21, the subject matter of any one or more of Examples 1-20 may optionally include the clusters of outliers representing anomalous flights.

The above detailed description includes references to the accompanying drawings, which form a part of the detailed description. The drawings show, by way of illustration, specific embodiments that may be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is to allow the reader to quickly ascertain the nature of the technical disclosure, for example, to comply with 37 C.F.R. § 1.72(b) in the United States of America. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

What is claimed is:

1. A system, comprising:
    at least one processor;
    at least one memory device;
    wherein the at least one memory device stores a machine learning algorithm trained based on flight information to discover related groupings and identify clusters of outliers in the groupings and stores a program to cause the at least one processor to:
        derive, using a quadratic least squares model applied to a matrix of time-series flight parameter data for a flight, a mathematical signature for each flight parameter of each flight in a set of data including a plurality of sensor readings corresponding to time-series flight parameters of a plurality of flights;
        aggregate the derived mathematical signatures into a dataset;
        measure a similarity between each pair of flights within the plurality of flights by calculating a distance metric between the mathematical signatures for each flight parameter of each pair of flights within the dataset;
        combine the measured similarities with the dataset; and
        apply the machine-learning algorithm to the dataset to discover related groupings of data based on the calculated distance metric and identify clusters of outliers within the dataset by using a unified distance matrix to train the machine-learning algorithm, wherein:
    new data corresponding to a flight parameter is acquired from a flight sensor;
    contemporaneously with acquisition of the new data corresponding to the flight parameter, the new data corresponding to the flight parameter is processed using the trained machine-learning algorithm to detect when the new data is an outlier of the flight parameter and generate an alert; and
    an adjustment to an avionics device is generated to prevent or mitigate a hazardous condition responsive to the alert being generated.

2. The system of claim 1, wherein the adjustment to the avionics device is generated in response to receiving input from an aircraft operator after the aircraft operator receives the alert.

3. The system of claim 1, wherein the distance metric is a Euclidean metric.

4. The system of claim 1, wherein the distance metric is a Mahalanobis metric or a standard deviation metric.

5. The system of claim 1, wherein the avionics device comprises an aircraft engine component, wherein the alert corresponds to engine failure, and wherein a pilot input is received to generate the adjustment to the avionics device to prevent a stall or spin.

6. The system of claim 1, wherein the alert corresponds to control link failure and the adjustment is based on a missing information in a telemetry file.

7. The system of claim 1, wherein the clusters of outliers represent anomalous flights.

8. The system of claim 1, wherein the quadratic least squares model is applied to the matrix as a function of time, wherein the machine-learning technique comprises a self-organizing map, and wherein the at least one memory device stores a program to cause the at least one processor to render a two-dimensional representation of the self-organizing map, including a visual indication of the clusters of outliers, for presentation to a user.

9. A non-transitory computer-readable medium, comprising a machine learning algorithm trained based on flight information to discover related groupings and identify clusters of outliers in the groupings and a plurality of instructions that, in response to being executed on a system comprising a computing device coupled to an avionics device, cause the computing device to:
    derive, using a quadratic least squares model applied to a matrix of time-series flight parameter data for a flight, a mathematical signature for each flight parameter of each flight in a set of data including a plurality of sensor readings corresponding to time-series flight parameters of a plurality of flights;
    aggregate the derived mathematical signatures into a dataset;
    measure a similarity between each pair of flights within the plurality of flights by calculating a distance metric between the mathematical signatures for each flight parameter of each pair of flights within the dataset;
    combine the measured similarities with the dataset; and apply the machine-learning algorithm to the dataset to discover related groupings of data based on the calculated distance metric and identify clusters of outliers within the dataset by using a unified distance matrix to train the machine-learning algorithm, wherein:
new data corresponding to a flight parameter is acquired from a flight sensor;
contemporaneously with acquisition of the new data corresponding to the flight parameter, the new data corresponding to the flight parameter is processed using the trained machine-learning algorithm to detect when the new data is an outlier of the flight parameter and generate an alert; and
an adjustment to an avionics device is generated to prevent or mitigate a hazardous condition responsive to the alert being generated.

10. The non-transitory computer-readable medium of claim 9, wherein the adjustment to the avionics device is generated in response to receiving input from an aircraft operator after the aircraft operator receives the alert.

11. The non-transitory computer-readable medium of claim 9, wherein the distance metric is a Euclidean metric.

12. The non-transitory computer-readable medium of claim 9, wherein the distance metric is a Mahalanobis metric or a standard deviation metric.

13. The non-transitory computer-readable medium of claim 9, wherein the avionics device comprises an aircraft engine component, wherein the alert corresponds to engine failure, and wherein a pilot input is received to generate the adjustment to the avionics device to prevent a stall or spin.

14. The non-transitory computer-readable medium of claim 9, wherein the alert corresponds to control link failure and the adjustment is based on a missing information in a telemetry file.

15. The non-transitory computer-readable medium of claim 9, wherein the clusters of outliers represent anomalous flights.

16. The non-transitory computer-readable medium of claim 9, the quadratic least squares model is applied to the matrix as a function of time, wherein the machine-learning technique comprises a self-organizing map, and wherein the instructions cause the computing device to render a two-dimensional representation of the self-organizing map, including a visual indication of the clusters of outliers, for presentation to a user.

17. A method in which a machine learning algorithm is trained based on flight information to discover related groupings and identify clusters of outliers in the groupings, comprising:
deriving, using a quadratic least squares model applied to a matrix of time-series flight parameter data for a flight, a mathematical signature for each flight parameter of each flight in a set of data including a plurality of sensor readings corresponding to time-series flight parameters of a plurality of flights;
aggregating the derived mathematical signatures into a dataset;
measuring a similarity between each pair of flights within the plurality of flights by calculating a distance metric between the mathematical signatures for each flight parameter of each pair of flights within the dataset;
combining the measured similarities with the dataset; and
applying the machine-learning algorithm to the dataset to discover related groupings of data based on the calculated distance metric and identify clusters of outliers within the dataset by using a unified distance matrix to train the machine-learning algorithm, wherein:
new data corresponding to a flight parameter is acquired from a flight sensor;
contemporaneously with acquisition of the new data corresponding to the flight parameter, the new data corresponding to the flight parameter is processed using the trained machine-learning algorithm to detect when the new data is an outlier of the flight parameter and generate an alert; and
an adjustment to an avionics device is generated to prevent or mitigate a hazardous condition responsive to the alert being generated.

18. The method of claim 17, wherein the adjustment to the avionics device is generated in response to receiving input from an aircraft operator after the aircraft operator receives the alert.

19. The method of claim 17, wherein the distance metric is a Euclidean metric.

20. The method of claim 17, wherein the distance metric is a Mahalanobis metric or a standard deviation metric.

21. The method of claim 17, wherein the avionics device comprises an aircraft engine component, wherein the alert corresponds to engine failure, and wherein a pilot input is received to generate the adjustment to the avionics device to prevent a stall or spin.

22. The method of claim 17, wherein the alert corresponds to control link failure and the adjustment is based on a missing information in a telemetry file.

23. The method of claim 17, wherein the clusters of outliers represent anomalous flights.

24. The method of claim 17, wherein the quadratic least squares model is applied to the matrix as a function of time, and wherein the machine-learning technique comprises a self-organizing map, further comprising rendering a two-dimensional representation of the self-organizing map, including a visual indication of the clusters of outliers, for presentation to a user.

* * * * *